US012563729B2

(12) United States Patent
Kutter

(10) Patent No.: US 12,563,729 B2
(45) Date of Patent: Feb. 24, 2026

(54) METHOD FOR GENERATING VERTICAL CHANNEL STRUCTURES IN THREE-DIMENSIONALLY INTEGRATED SEMICONDUCTOR MEMORIES

(71) Applicant: Fraunhofer-Gesellschaft zur Förderung der angewandten Forschung e.V., Munich (DE)

(72) Inventor: Christoph Kutter, Munich (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 511 days.

(21) Appl. No.: 17/933,513

(22) Filed: Sep. 20, 2022

(65) Prior Publication Data
US 2023/0092338 A1　Mar. 23, 2023

(51) Int. Cl.
H10B 43/27 (2023.01)
H10B 41/27 (2023.01)

(52) U.S. Cl.
CPC ............. H10B 43/27 (2023.02); H10B 41/27 (2023.02)

(58) Field of Classification Search
None
See application file for complete search history.

(56) References Cited

U.S. PATENT DOCUMENTS

| | | |
|---|---|---|
| 5,155,657 A | 10/1992 | Oehrlein |
| 8,445,347 B2 | 5/2013 | Alsmeier |

| | | |
|---|---|---|
| 9,362,302 B1 | 6/2016 | Lai |
| 9,484,353 B1 | 11/2016 | Lai |
| 9,768,234 B2 | 9/2017 | Jo |
| 9,941,299 B1 | 4/2018 | Chen et al. |
| 10,332,835 B2 | 6/2019 | Lai |
| 10,510,415 B1 | 12/2019 | Huo et al. |
| 10,608,013 B1 | 3/2020 | Xiao |
| 11,069,410 B1 | 7/2021 | Cui et al. |
| 11,271,007 B2 | 3/2022 | Xia |
| 11,862,565 B2 | 1/2024 | Sun |

(Continued)

FOREIGN PATENT DOCUMENTS

| | | |
|---|---|---|
| CN | 105118916 B | 9/2018 |
| CN | 112242403 A | 1/2021 |

(Continued)

OTHER PUBLICATIONS

Korean language office action dated Feb. 1, 2024, issued in application No. KR 10-2022-0118807.

(Continued)

*Primary Examiner* — Sarah K Salerno
(74) *Attorney, Agent, or Firm* — McClure, Qualey & Rodack, LLP

(57) ABSTRACT

The present invention relates to a specific method step (channel hole etching) in the production of a three-dimensionally integrated semiconductor memory. According to the invention, this method step is characterized in that the vertical channel structure to be generated thereby, the so-called channel hole, is generated by applying an anodic etching method. Thereby, layer stacks having significantly more individual layers than in conventional technology can be processed. Accordingly, the number of individual layers within a layer stack to be processed can be increased, whereby the memory capacity of the layer stack can also be increased significantly.

16 Claims, 12 Drawing Sheets

(56) References Cited

U.S. PATENT DOCUMENTS

| 12,302,561 | B2 | 5/2025 | Kang |
|---|---|---|---|
| 2012/0256247 | A1 | 10/2012 | Alsmeier |
| 2014/0306279 | A1 | 10/2014 | Park |
| 2016/0126292 | A1 | 5/2016 | Yanagida et al. |
| 2017/0025428 | A1 | 1/2017 | Lai |
| 2017/0287930 | A1 | 10/2017 | Lee |
| 2017/0358590 | A1 | 12/2017 | Kang |
| 2020/0098781 | A1 | 3/2020 | Xiao |
| 2021/0020650 | A1 | 1/2021 | Yang et al. |
| 2021/0066337 | A1 | 3/2021 | Xia et al. |
| 2022/0093641 | A1 | 3/2022 | Wang |
| 2023/0087266 | A1 | 3/2023 | Heigl |

FOREIGN PATENT DOCUMENTS

| DE | 10 2009 042 321 | A1 | 3/2011 |
|---|---|---|---|
| KR | 10-2021-0024641 | A | 3/2021 |
| WO | 2019/108366 | A1 | 6/2019 |

OTHER PUBLICATIONS

English language translation of office action dated Feb. 1, 2024 (pp. 1-6 of attachment).

Chinese language office action dated Apr. 14, 2023, issued in application No. TW 111134636.

English language translation of office action issued in application No. TW 111134636 (pp. 1-3 of attachment).

Lehmann, V., et al.; "Porous silicon formation: A quantum wire effect;" Appl. Phys. Lett. 58, 856 1991; Mar. 1990; pp. 855-858.

Lehmann, V.; "The Physics of Macropore Formation in Low Doped n-Type Silicon;" J. Electrochem. Soc.; vol. 140; No. 10; Oct. 1993; pp. 2836-2843.

Wehrspohn, R.B., et al.; "Spatial versus quantum confinement in porous amorphous silicon nanostructures;" European Physical Journal B 8; 1999; pp. 179-193.

Entegris; "Cosiderations for Improving 3D NAND Performance, Reliability, and Yield, White paper," 1-7.

Samsung; "System Consulting Report / Samsung 3D NAND;" 2018; pp. 157-164.

Notice of Allowance dated Oct. 21, 2025, issued in U.S. Appl. No. 17/933,508.

10

20

6

6

2

1

10

20

2
1

11

METHOD FOR GENERATING VERTICAL CHANNEL STRUCTURES IN THREE-DIMENSIONALLY INTEGRATED SEMICONDUCTOR MEMORIES

CROSS-REFERENCE TO RELATED APPLICATIONS

This application claims priority from European Patent Application No. 21197599.0, which was filed on Sep. 20, 2021, and is incorporated herein in its entirety by reference.

The innovative concept described herein relates to a specific method step for generating vertical channel structures in a method for generating a three-dimensionally integrated semiconductor memory. In this context, these vertical channel structures are also referred to as vertical channel holes. In the context of 3D semiconductor memories, the respective method is also referred to as vertical channel hole etching. The innovative concept descried herein describes a novel method for generating vertical channel structures with a high anisotropy, such that the number of layers in a vertical semiconductor memory and hence its memory capacity can be significantly increased.

BACKGROUND OF THE INVENTION

The present invention is in the technical field of producing three-dimensionally integrated semiconductor memories, such as three-dimensional NAND flash memories. Compared to conventional planar technology (x-y direction), devices are additionally generated in vertical direction (z direction) in three-dimensional integration.

So-called flash memory elements are realized, for example, by NAND cells. For obtaining a high memory capacity of flash memories, the involved NAND cells are vertically arranged on top of one another, which is also referred to as a three-dimensional system integration. Such a three-dimensional memory device having several memory cells arranged vertically on top of one another is also referred to as a 3D NAND.

In conventional production methods for producing 3D NAND memories, many individual layers of $Si_3N_4$—$SiO_2$ (silicon nitride-silicon (di-)oxide) are stacked on top of each other, such that a vertical layer stack results. By means of vertically etched holes within the layer stack, the individual layers of the layer stack are then laterally exposed in order to subsequently etch the $Si_3N_4$ layers selectively to the $SiO_2$ layers.

This is one of the core processes in the production of vertical memory cell structures, also known as so-called "hole channel etching". The above-mentioned vertically etched holes generated thereby can also be referred to as channel structures due to their geometrical shape. In these etched channel structures, which can also be referred to as "hole channel" within the "hole channel etching", the flash memory cell will be set up in subsequent processes. In order to obtain memory densities or memory capacities that are as high as possible, nowadays, up to 100 alternating levels of $SiO_2$ and $Si_3N_4$ are deposited, such that accordingly a vertical layer stack having up to 100 alternating $SiO_2$ and $Si_3N_4$ layers is formed, which then again forms the vertical memory cell structure. As already mentioned above, this vertical layer stack (order 6-10 μm) is processed with the method of "hole channel etching" (order of the hole diameter approximately 100 nm, order of the distance of the holes approximately 25 nm).

Thus, in order to increase the memory capacity of such a vertical layer stack, the number of individual layers stacked on top of each other has to be increased. Obviously, with the increasing number of individual layers the height of the vertical layer stack also increases and accordingly the vertical channel structures have to be made deeper, i.e., the aspect ratio (depth to width) of the vertical channel structures has to be increased.

As already mentioned above, providing the vertical channel structures has, among others, the effect of providing access to the individual layers stacked on top of each other and to etch the $Si_3N_4$ layers selectively to the $SiO_2$ layers via this access.

However, due to the just mentioned increase of the aspect ratio of the vertical channel structures, it becomes increasingly difficult to generate a channel hole having a constant diameter with previously known methods. In reality, the etching rate is not perfectly aligned (perpendicular to the layer stack) but has a lateral component, such that a channel hole having a greater diameter at the top than at the bottom results. Thus, within the vertical channel structure, an approximately funnel-shaped necking tapering towards the bottom is formed.

For that reason, the vertical channel structures cannot be implemented at any depth, since otherwise, due to the extremely high aspect ratio, more and more distinct deviations from the ideal channel result. Nowadays, up to 100 individual layers can be etched with this technology (so-called high aspect radio channel etch). Thus, the number of individual layers within a vertical layer stack is limited to those approximately 100 individual layers. However, this is also means that the vertical layer stack may not have substantially more individual layers, which again limits the memory capacity of the vertical layer stack accordingly. The resulting problem is a limitation of the number of individual layers within the vertical layer stack and hence a respective limitation of the memory capacity.

SUMMARY

According to an embodiment, a method for generating a vertical channel structure in a layer stack when producing three-dimensionally integrated semiconductor memories may have the steps of: providing a substrate with a layer stack including several individual layers arranged thereon, wherein several individual layers of a first material as well as several individual layers of a different second material are deposited alternately on top of each other, wherein the first material and the second material are each electrically conductive or semi-conductive, generating at least one vertical channel structure in the layer stack, wherein the vertical channel structure extends in vertical direction at least in portions through the layer stack, such that one or several of the individual layers are exposed within the vertical channel structure and are made accessible by the vertical channel structure, characterized in that structuring the vertical channel structure in the layer stack is performed by applying an anodic etching method, wherein a first electric voltage potential is applied to a first portion of the layer stack, and wherein a different second electric voltage potential is applied to a different second portion of the layer stack, wherein an electric current flows vertically through the layer stack between the first and the second portion, which generates the vertical channel structure in the layer stack by directional anodic etching.

Another embodiment may have a layer stack for usage in the production of a three-dimensionally integrated semiconductor memory, wherein the layer stack includes a plurality of vertical channel structures that are produced according to the inventive method.

Another embodiment may have a three-dimensionally integrated semiconductor memory with an inventive layer stack.

The inventive method essentially serves to generate vertical channel structures (channel holes) in a vertical layer stack when producing three-dimensionally integrated semiconductor memories. Here, first, a substrate is provided. On the substrate, a vertical layer stack having several individual layers layered on top of each other is generated by alternately depositing several individual layers of a first material as well as several individual layers of a different second material on top of each other. The first material and the second material are each electrically conductive or semiconductive. At least one vertical channel structure is generated in the layer stack, wherein the vertical channel structure at least partly through the layer stack extends in vertical direction, such that one or several of the individual layers are exposed within the vertical channel structure and are accessible by the vertical channel structure. The inventive method is particularly characterized in that structuring the vertical channel structure takes place by applying an anodic etching method. Here, a first electric voltage potential is applied to a first portion of the layer stack and a different second electric voltage potential is applied to a different second portion of the layer stack. Thus, an electric current that generates the vertical channel structure in the layer stack by directional anodic etching flows vertically through the layer stack between the first and second portions.

In the above discussed known vertical semiconductor memories of conventional technology, vertical layer stacks are generated of alternately subsequent $Si_3N_4$ layers and $SiO_2$ layers. For etching these layers, anisotropic etching methods, such as directional ion beam deep etching, are used. The aspect ratios of the vertical channel structures to be generated by means of these anisotropic etching methods are limited, such that the number of individual layers is also limited.

However, the inventive method suggests using, instead of the previously used anisotropic etching methods, a directional anodic etching method for the so-called channel hole etching in the production of three-dimensionally integrated semiconductor memories. Compared to previously used etching technologies (e.g., ion beam deep etching), directional anodic etching has a significantly higher etching rate homogeneity, i.e., the vertical channel structures can be generated with a significantly greater aspect ratio, whereby significantly deeper channel structures can be generated within the layer stack. In anodic etching, no funnel-shaped necking occurs as in conventional technology. Due to the option of generating significantly deeper channel structures, the number of individual layers within a vertical layer stack can be significantly increased, such that the memory capacity of a three-dimensionally integrated semiconductor memory generated thereby can be significantly increased accordingly.

BRIEF DESCRIPTION OF THE DRAWINGS

Embodiments of the present invention will be detailed subsequently referring to the appended drawings, in which.

DETAILED DESCRIPTION OF THE INVENTION

Figure 1B:
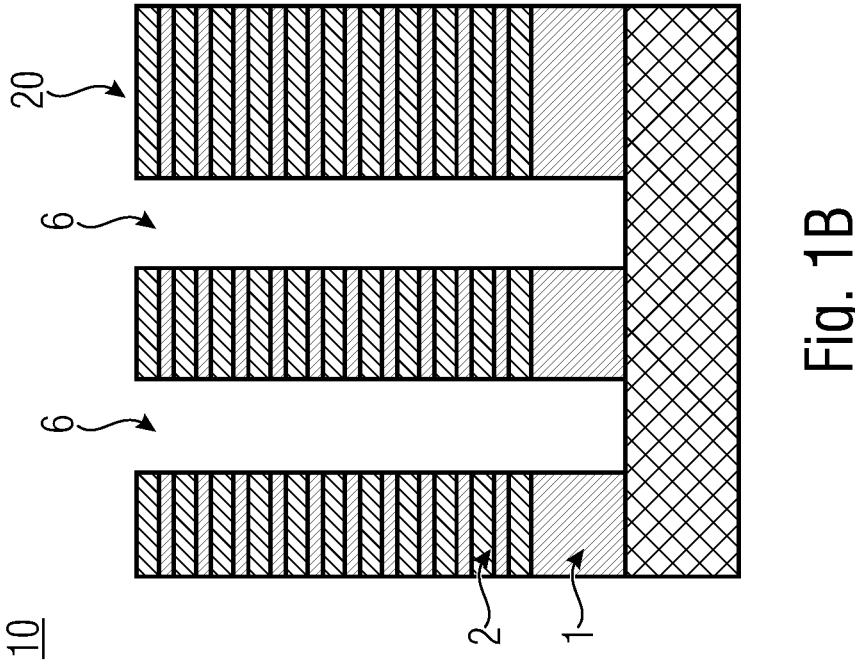
FIGS. 1A-1E are schematic sectional side views for illustrating individual method steps for producing a conventional 3D semiconductor memory with conventional methods according to conventional technology.

In the following, embodiments are described in more detail with reference to the figurers, wherein elements having a same or similar function are provided with the same reference numbers.

Method steps illustrated or described within the present disclosure can also be implemented in a different order than the shown or described order. Additionally, methods steps relating to a specific feature of an apparatus can also be exchanged with the feature of this apparatus, which also applies vice versa.

When this disclosure relates to a vertical direction, this is the direction that is perpendicular to the plane spanned by an individual layer. If, for example, an individual layer extends in the x-y plane with respect to its length and width, the vertical direction corresponds to the z-axis. In that case, for example, the length and width of the individual layer are measured in x- or y-direction, and the thickness of the individual layer is measured in the z direction. Within the layer stack, the respective individual layers are stacked on top of each other along this vertical direction (z-axis), such that, starting from the substrate, the layer stack extends vertically towards the top.

When this disclosure relates to a lateral direction, this is the direction that runs within or parallel to an x-y plane spanned by an individual layer or runs perpendicular to the vertical extension direction (z-axis) of the layer stack. In the case of a vertically extending layer stack, the lateral direction can therefore be essentially equal to a horizontal direction.

Before the inventive method is described, first, conventional technology will be discussed. FIG. 1A to 1E show a method for producing a three-dimensionally integrated semiconductor memory 10 according to conventional technology. As can be seen in FIG. 1A, first, several individual layers 1, 2 are arranged alternately on top of each other on a silicon substrate 11. These are individual layers 1 of silicon oxide ($SiO_2$) as well as individual layers 2 of silicon nitride ($Si_3N_4$). These individual layers 1, 2 arranged alternately on top of each other form a vertical layer stack 20.

Figure 1A:
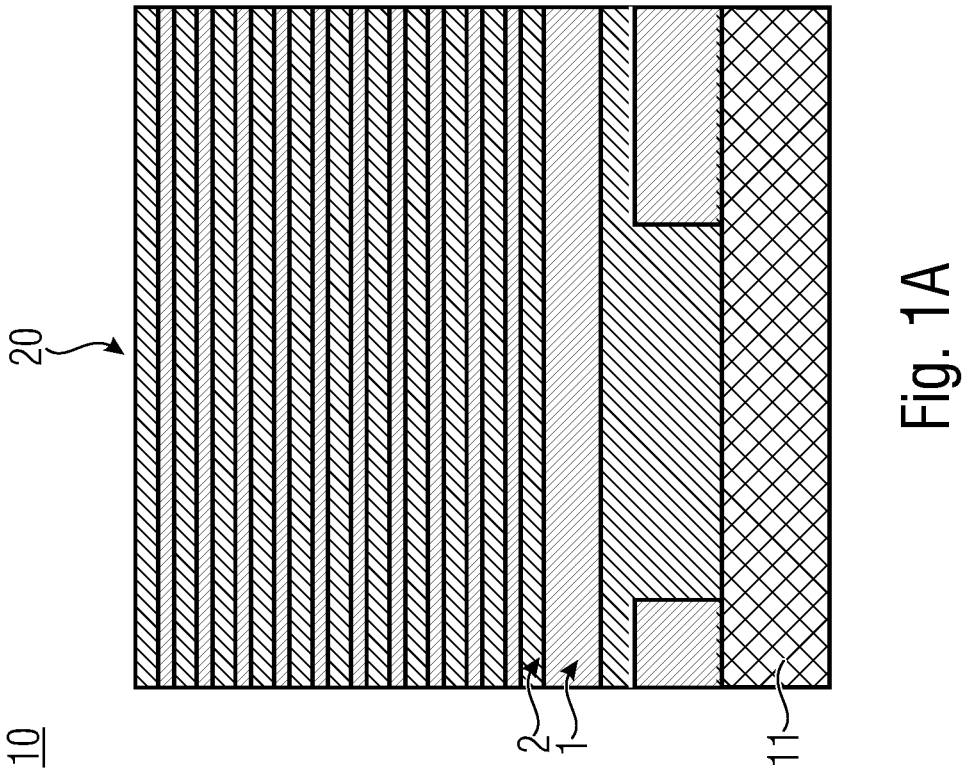

FIG. 1B shows a next process step, wherein one or several vertical recesses 6 are structured into the vertical layer stack 20.

Figures 1C, 1D:
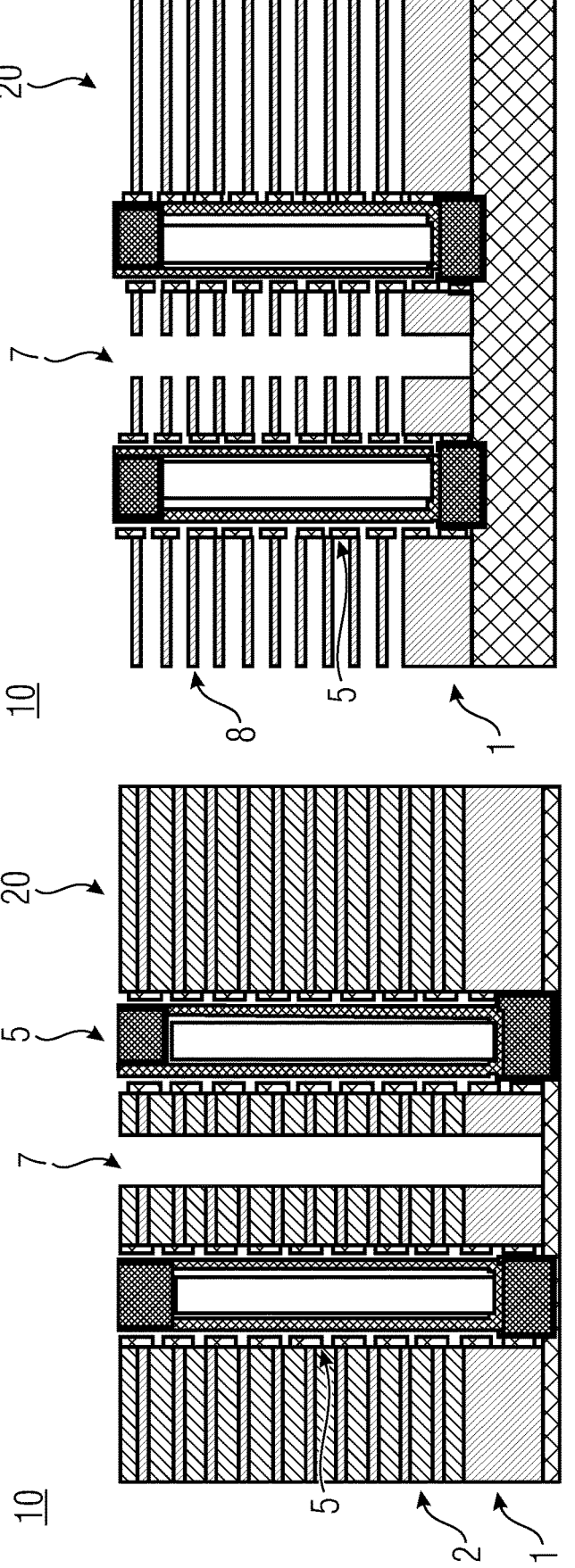

FIG. 1C shows that support structures 5 can be generated in the vertical recesses 6. The support structures 5 are mechanically connected to the individual layers 1, 2 and stabilize the individual layers 1, 2. The support structures 5 can form a gate NAND structure in the semiconductor memory.

A vertical channel structure 7 is structured into the layer stack 20 between the two support structures 5. This is the so-called "hole channel etching". By the vertical channel structure 7, the individual layers 1, 2 are laterally exposed, such that the individual layers 1, 2 are freely accessible within the vertical channel structure 7.

During a wet chemical etching process, hot phosphoric acid can enter into the layer stack 20 through the vertical channel structure 7. Thereby, the hot phosphoric acid reaches the exposed individual layers 1, 2 and selectively etches out the silicon nitride individual layers 2, such that only the silicon oxide individual layers 1 remain (FIG. 1D). Between the silicon oxide individual layers 1, voids 8 result at the locations where the silicon nitride individual layers 2 had been.

Figure 1E:
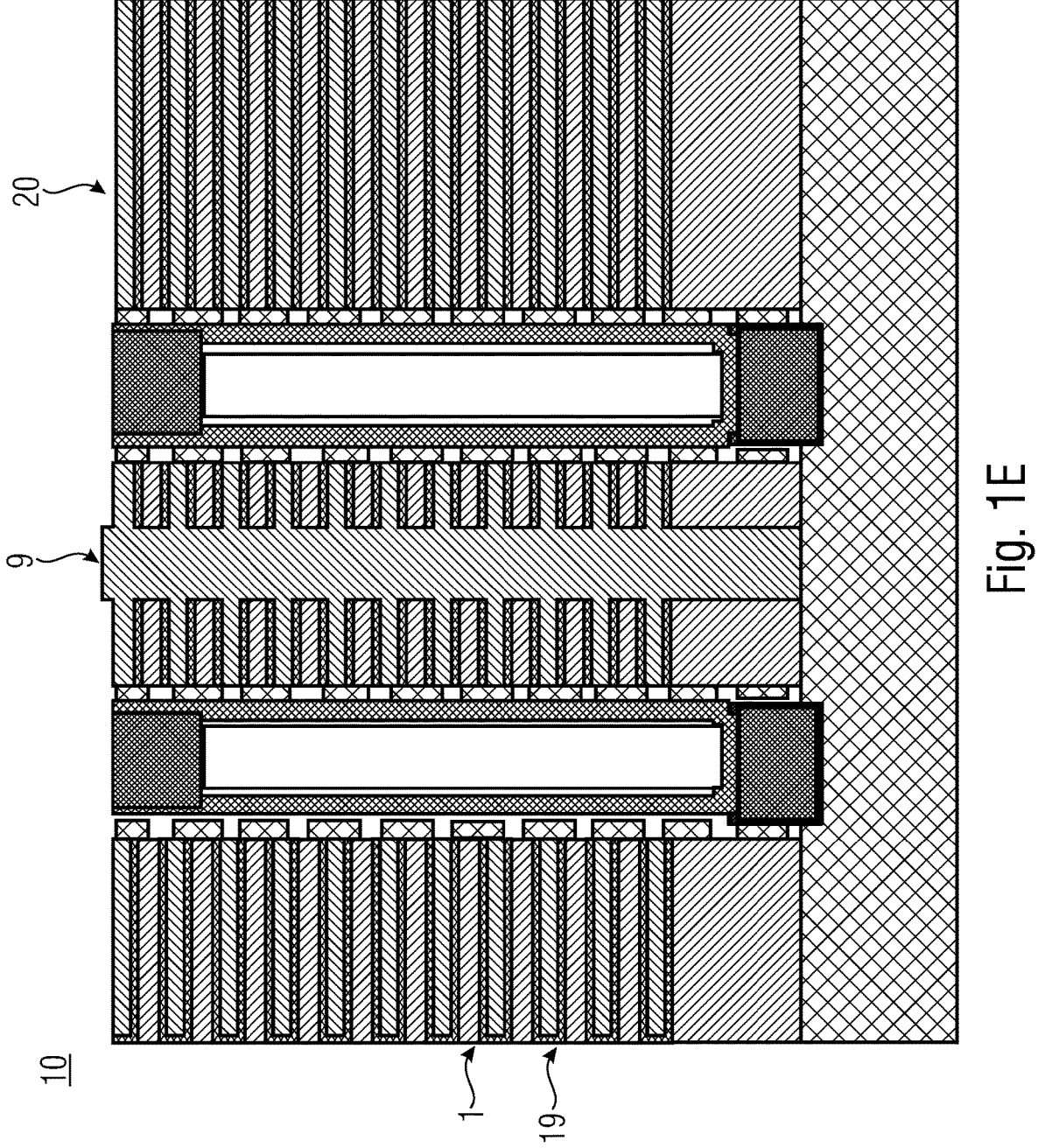

As can be seen in FIG. 1*e*, these voids 8 are then filled with tungsten 9. This results in vertical layer stack 20 results comprising silicon oxide individual layers 1 arranged alternately on top of each other as well as tungsten individual layers 19.

As has already been mentioned above, the production of 3D NAND memory cells intends to increase their memory capacity per volume. This is obtained, among others, by alternately stacking more and more individual layers of silicon nitride ($Si_3N_4$) and silicon oxide ($SiO_2$) on top of each other, but obviously also increases the overall height of the vertical layer stack 20. In order to be able to etch laterally all silicon nitride individual layers 10, the vertical channel structure 7 is introduced into the layer stack 20, as has already been mentioned above. By the vertical channel structure 7, hot phosphor acid reaches the silicon nitride individual layers 2 exposed and made accessible within the vertical channel structure 7. However, with increasing height of the layer stack 20, the aspect ratio of the vertical channel structure 7 also has to be increased accordingly, i.e., the vertical channel structure 7 has to become deeper. However, with increasing aspect ratio, more and more etching rate inhomogeneities result along the vertical channel structure 7, i.e., towards the bottom, an increasing isotropic portion of the otherwise anisotropic etching portion is obtained. Thus, some sort of funnel-shaped necking towards the bottom of the vertical channel structure 7 results.

Such a funnel-shaped necking can have the effect that the layer stack 20 cannot be fully etched through. By the funnel shape, the vertical channel structure 7 has different dimensions along its depth, which can exceed and fall below the target size, which makes useful production of the memory impossible.

Figure 1F:
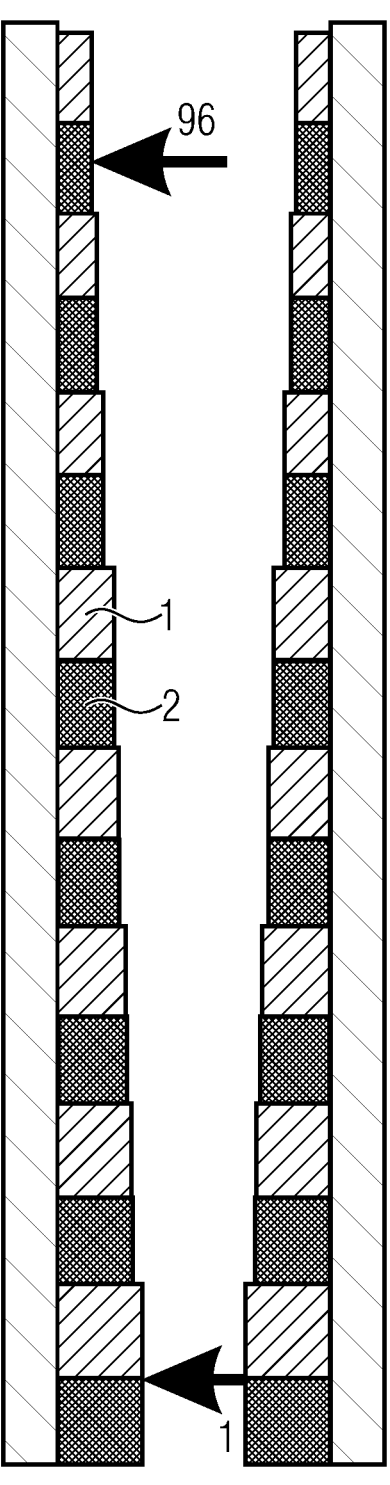
FIG. 1F is a section of a schematic sectional side view of a vertical recess in a conventional layer stack according to conventional technology for illustrating the problems existing with the previously used methods.

FIG. 1F illustrates this problem. Here, a section of a vertical channel structure 7 (channel hole) within a layer stack having several individual layers 1, 2 arranged alternately on top of each other is shown merely schematically. These are silicon oxide layers 1 and silicon nitride layers 2. The silicon nitride layers 2 are etched selectively to the silicon oxide layers 1.

As can be seen in FIG. 1F, when generating the vertical channel structure (channel hole etching), a funnel-shaped necking results, wherein the diameter at the bottom end of the vertical channel structure 7 is significantly smaller than the diameter at the top end of the vertical channel structure 7.

The resulting problem is a limitation of the number of individual layers within the layer stack and the associated limitation of the memory capacity. This means the vertical channel structure 7 cannot be implemented in any depth, as otherwise more and more distinct constrictions with the funnel-shaped neckings shown herein result. Currently, by this technology, up to 96 individual layers can be etched vertically and then laterally etched selectively. Thus, the number of individual layers within a layer stack is limited to those 96 individual layers. However, this also means that the layer stack may not comprise significantly more individual layers, which, however, limits the memory capacity of the layer stack accordingly.

The novel method for channel hole etching in the production of 3D semiconductor memories described herein allows generating the vertical channel holes across a large number of individual layers with a significantly distinct anisotropy, which results in significantly less distinct funnel-shaped neckings along the channel hole in the vertical layer stack, such that the number of individual layers within a layer stack can be significantly increased to increase the memory capacity of the semiconductor memory accordingly.

Figure 2:
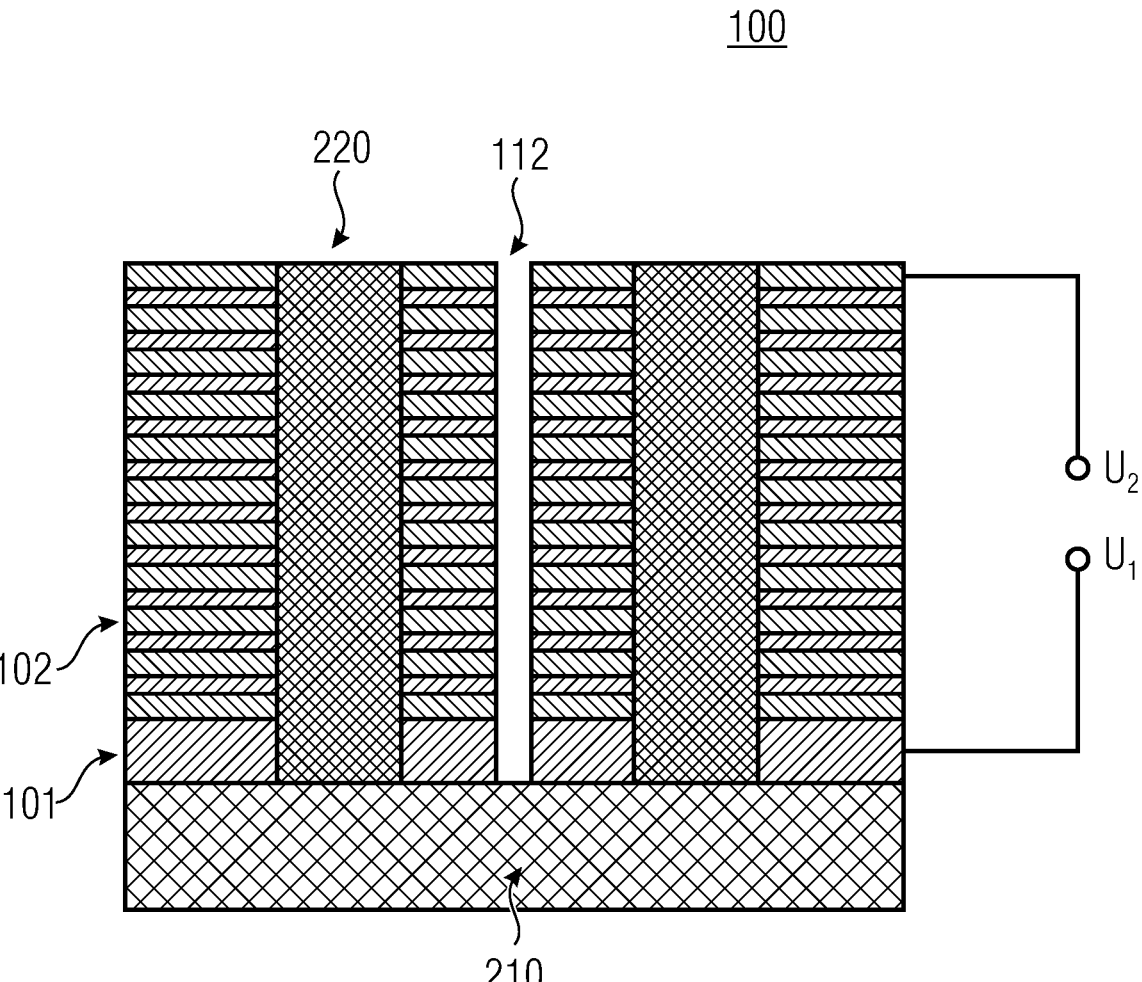
FIG. 2 is a schematic sectional side view of a layer stack as it can be generated according to the inventive method step.

First, FIG. 2 shows a schematic view of an inventive vertical layer stack 100 with a vertical channel structure 112 (channel hole) generated by applying an inventive method (channel hole etching). This vertical channel structure 112 is also referred to as channel hole and can have the shape of a hole, for example.

In the inventive method, first, a substrate 200 is provided. A layer stack 100 is generated on the substrate 200. The layer stack 100 comprises several individual layers 101, 102. This layer stack 100 is produced by alternately depositing individual layers 101 of first material as well as several individual layers 102 of a different second material on top of each other. The individual layers 101, 102 can be, for example, deposited alternately or grown epitaxially.

According to the invention, both the first material as well as the second material are each electrically conductive or semi-conductive. For example, the individual layers 101 of the first material can comprise a first doped semiconductor material or can consist of a first doped semiconductor material. Alternatively or additionally, the individual layers 102 of the second material can comprise a second doped semiconductor material or can consist of a second doped semiconductor material, wherein the first and the second doped semiconductor material are different.

Here, it is, for example, possible that the first doped semiconductor material comprises a different type of doping or a different degree of doping than the second doped semiconductor material. The degree of doping also referred to as doping strength is the strength of the doping. Here, it can be distinguished between strong doping ($n^+$; $p^+$), medium doping ($n$; $p$) and weak doping ($n^-$, $p^-$).

Due to the different doping (i.e., different type of doping and/or different degree of doping), the two semiconductor materials also have a different etching behavior. Thus, in a later method step (FIG. 3J), the one semiconductor material can be etched selectively to the respective other semiconductor material. Selective etching and the associated necessity of an etching selectivity of the one material with respect to the other material that is as large as possible will be discussed in more detail below with reference to FIGS. 3A to 3H and 3J to 3N.

The inventive method provides structuring at least one vertical channel structure 112 (channel hole) in the vertical layer stack 100. According to the invention, this vertical channel structure 112 is structured into the layer stack 100 by applying an anodic etching process. For the purpose of anodic etching, it is advantageous when both individual layers 101, 102 are electrically conductive or semi-conductive.

As shown exemplarily in FIG. 2, for performing the anodic etching process, a first electric potential $U_1$ can be applied to a first portion 210 of the layer stack 100.

Additionally, a second electric voltage potential $U_2$ that differs from the first electric voltage potential $U_1$ can be applied to a different second portion 220 of the layer stack 100. Thereby, an electric current that generates the vertical channel structure 112 in the layer stack 100 by directional anodic etching flows through the layer stack 100 between the first portion 210 and the second portion 220.

The first portion 210 of the layer stack 100 can, for example, be a portion 210 of the layer stack 100 facing the substrate 200 or being closest to the same. The first portion 210 of the layer stack can be, for example, a bottom of the layer stack 100. This can be, for example, the lowest individual layer, i.e., the one closest to the substrate 200.

The second portion 220 of the layer stack 100 can, for example, be a portion 220 of the layer stack 100 facing away from the substrate 200 or being most distant from the same. The second portion 220 of the layer stack 100 can be, for example, a top of the layer stack 100. This can be, for example, the top individual layer 101, 102, i.e., the individual layer furthest away from the substrate 200.

However, it would also be possible that the first portion 210 of the layer stack 100 is any individual layer in the bottom half of the layer stack 100 and that the second portion 220 of the layer stack 100 is any individual layer 101, 102 in the top half of the layer stack 100.

This can be among others due to the fact how deep is to be etched, i.e., up to what depth the vertical channel structure 112 is to be generated. If, for example, the vertical channel structure 112 is to be structured throughout the entire layer stack 100, down to the substrate 200, the first portion can be the bottom or the lowest individual layer 101, 102 of the layer stack 100. If, however, etching is to be performed only up to a specific individual layer in the bottom half of the layer stack 100, the first potential $U_1$ can be applied to this specific individual layer.

FIG. 2 merely shows a schematic view of the layer stack 100, wherein the respective individual layer 101, 102 is contacted directly. It would also be possible that a first electrode structure (not explicitly illustrated herein) is in contact with the first portion 210 (e.g., the bottom individual layer) of the substrate stack 100 and/or a second electrode structure (not explicitly illustrated herein) is in contact with the second portion 220 (e.g., the top individual layer) of the substrate stack 100. Thus, an electric voltage could be connected to the respective electrode structures. This will also be discussed below.

The first electric potential $U_1$ can have a first amount while the second electric potential $U_2$ can have a different second amount. For example, the first electric voltage potential $U_1$ can be a ground potential while the second electric voltage potential $U_2$ can have an amount with positive or negative sign differing from the ground potential.

Accordingly, the resulting electric current flows in vertical direction through the vertical layer stack 100 in dependence on its sign. This means the electric current flows, for example, from the first portion 210 (e.g., bottom) of the layer stack 100 in the direction of the second portion 220 (e.g., top) of the layer stack 100 in vertical direction through the layer stack 100 and generates the vertical channel structure 112. Thus, in this example, the electric current would flow from bottom to top.

The vertical channel structure 112 (channel hole) has, among others, the purpose of providing access for an etching medium into the inside of the layer stack 100. By means of the etching medium entering the layer stack 100 through the channel hole 112, the individual layers 101 of the one material can be etched selectively to the individual layers 102 of the respective other material when producing a three-dimensionally integrated semiconductor layer.

Figures 3A, 3B:
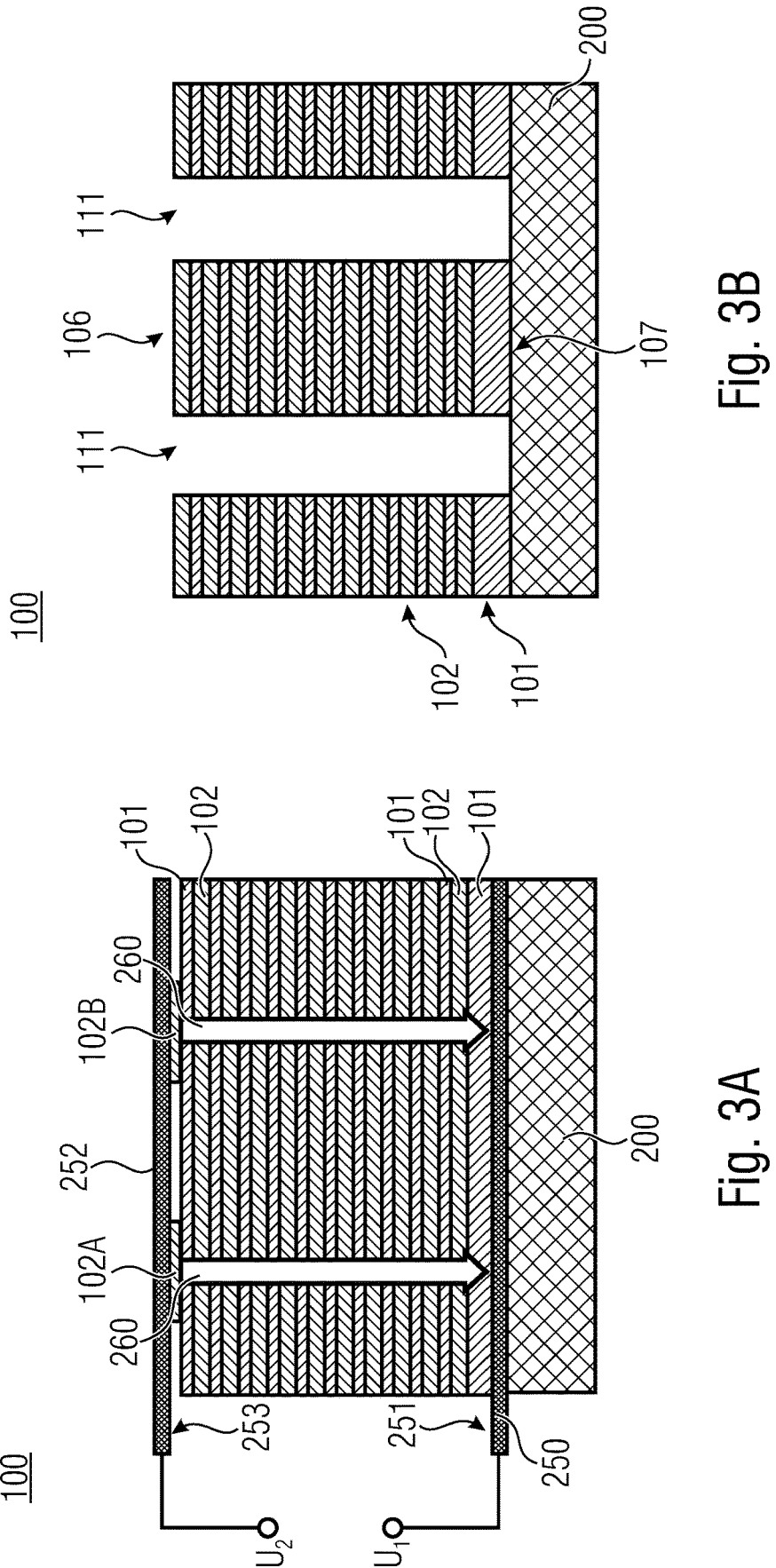
FIGS. 3A-3H are schematic sectional side views for illustrating individual (partly optional) method steps for producing an inventive 3D semiconductor memory according to a method according to the present invention.
Figures 3C, 3D:
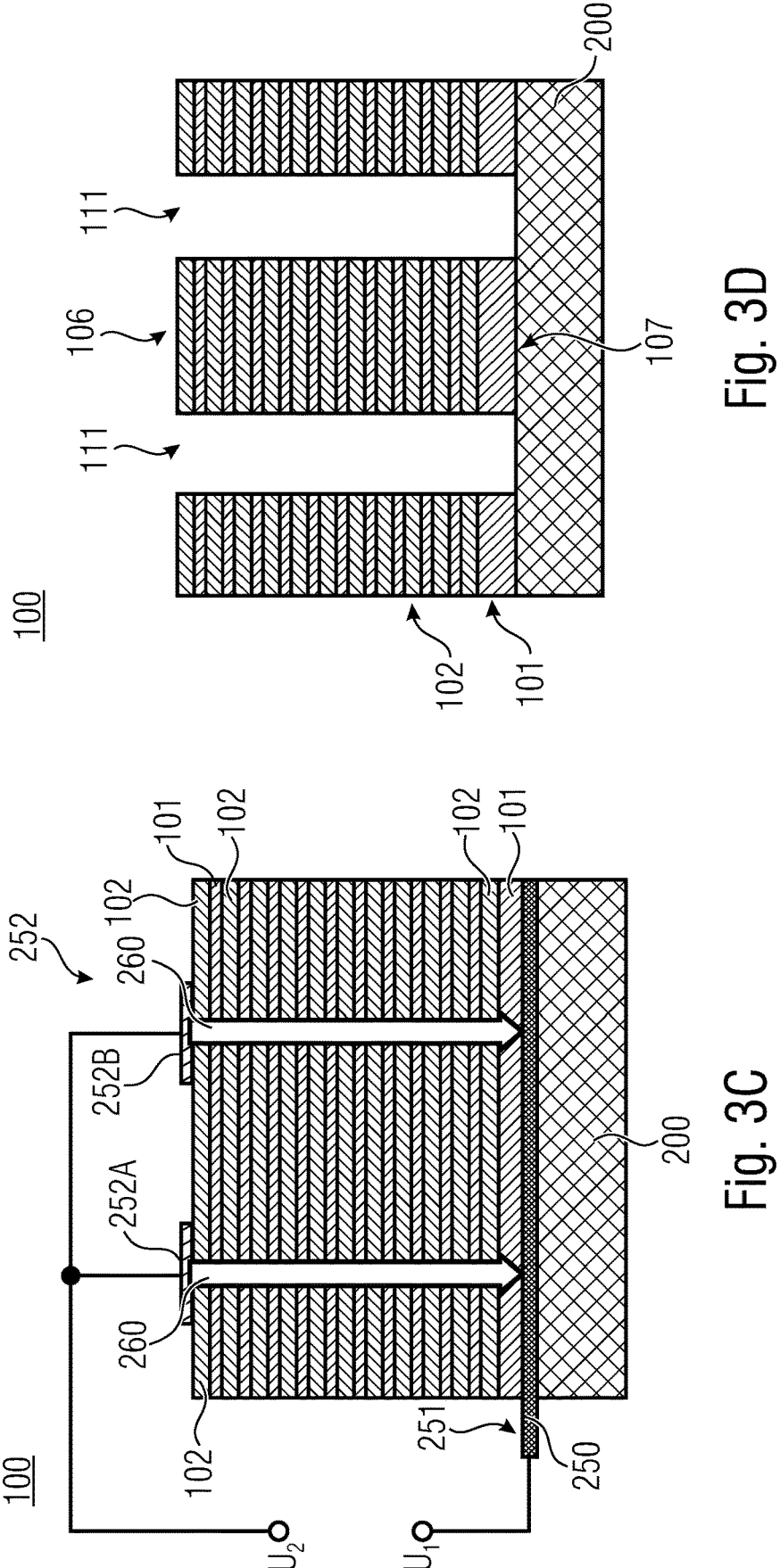
Figures 3E, 3F:
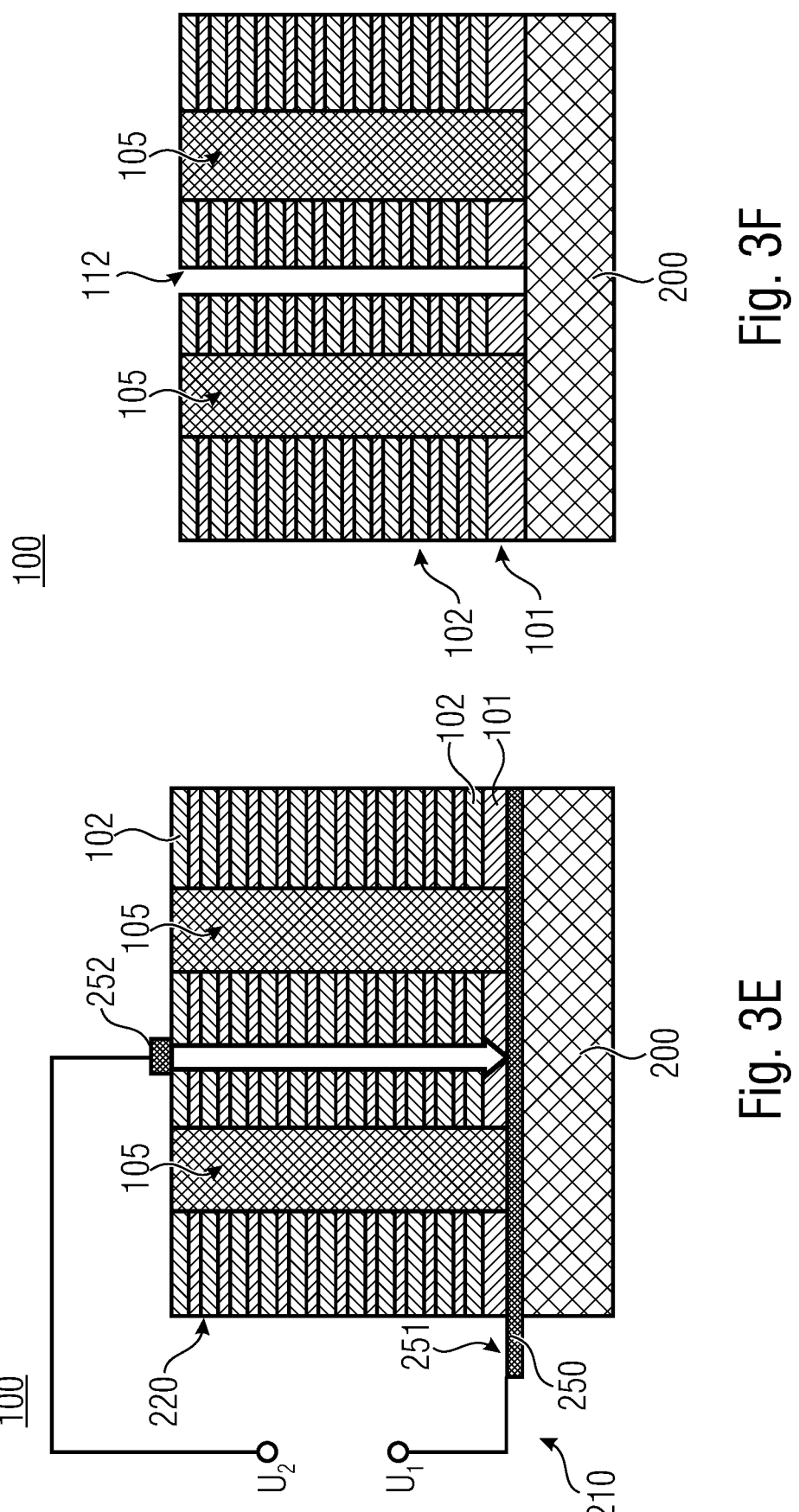
Figures 3G, 3H:
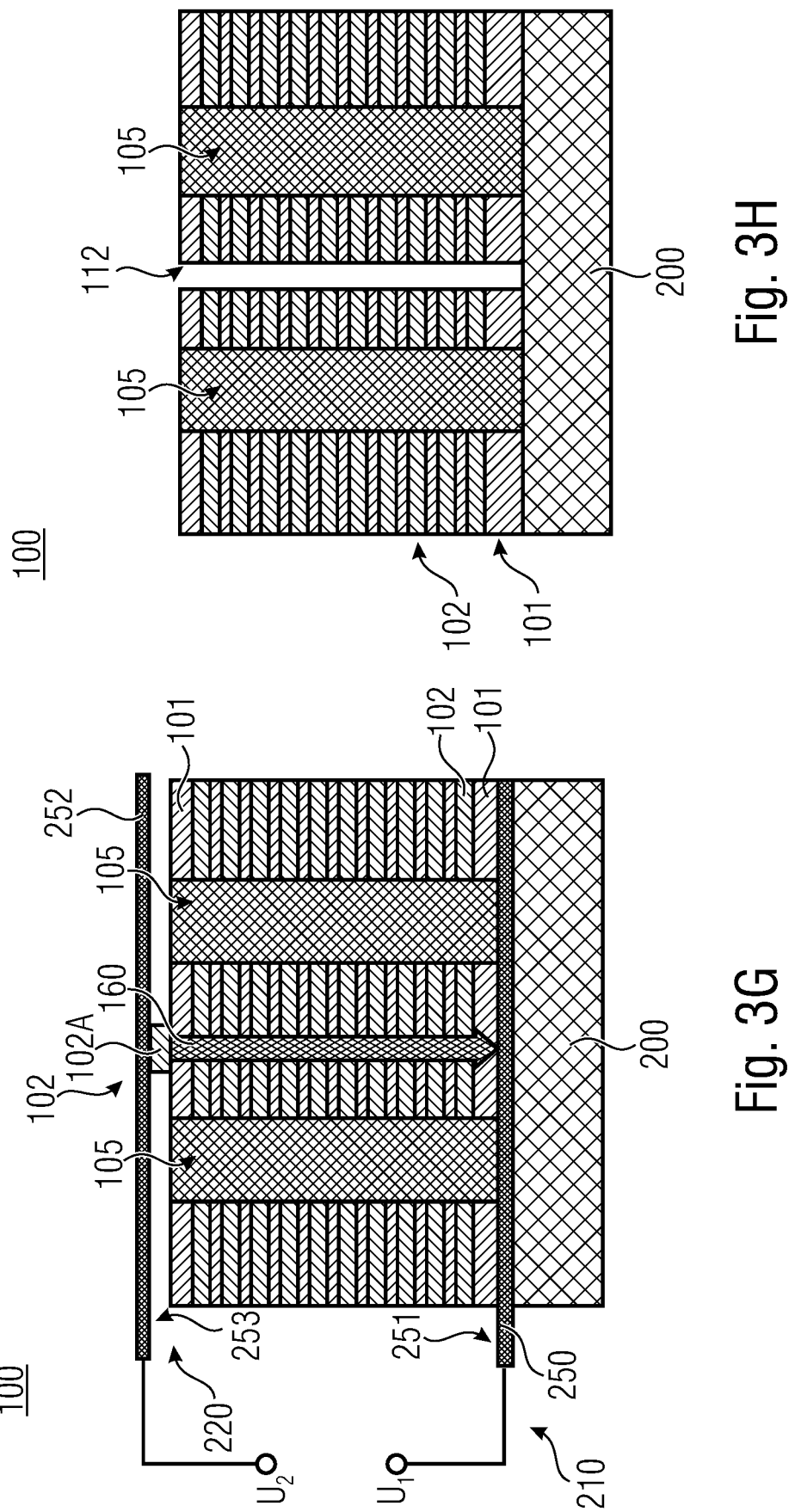
Figure 3J:
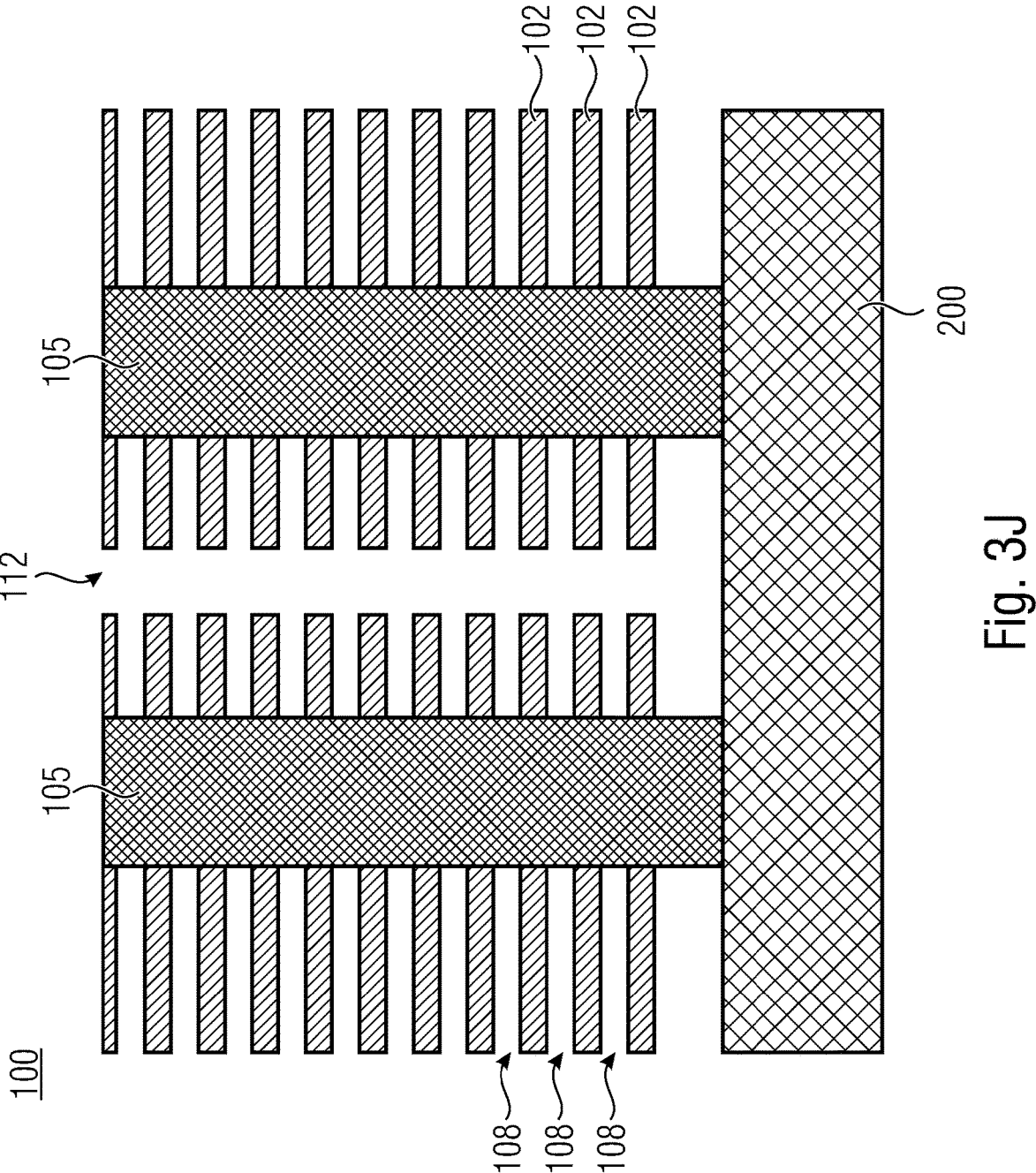
FIGS. 3J-3N show further schematic sectional side views for illustrating individual (partly optional) method steps for producing the inventive 3D semiconductor memory of FIGS. 3A-3H.
Figures 3K, 3L:
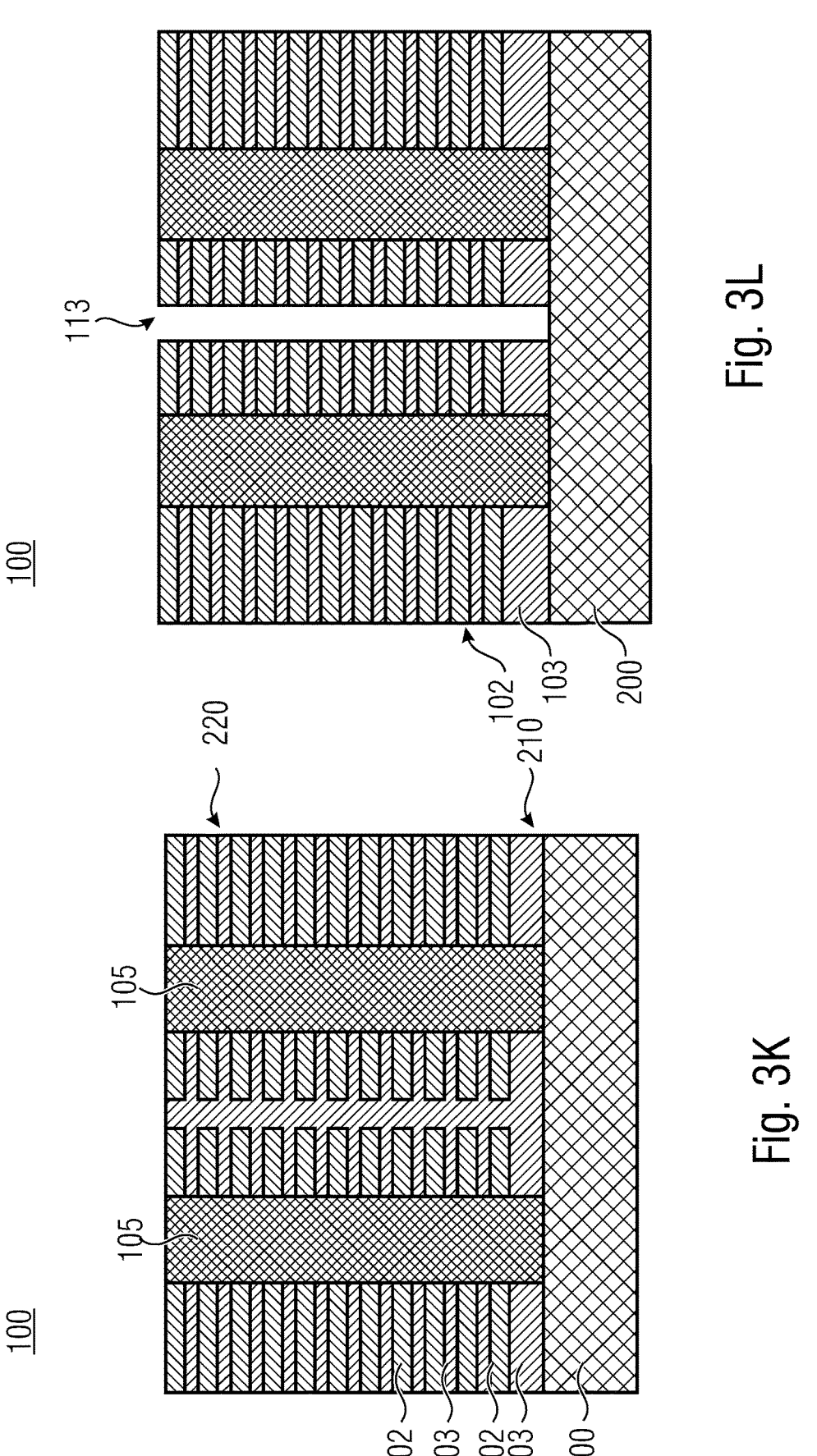
Figures 3M, 3N:
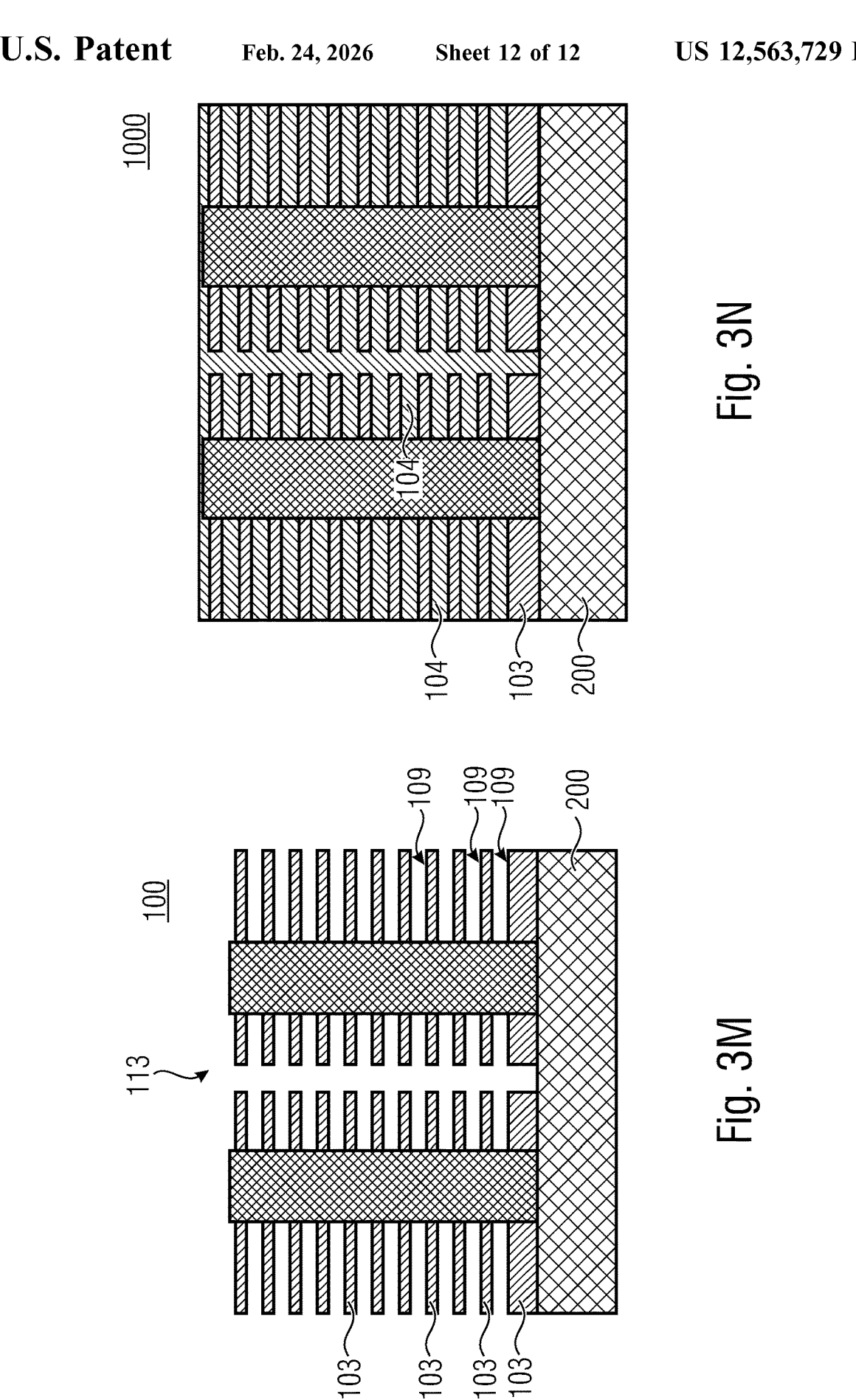

FIG. 3A to 3N schematically show individual method steps for generating a three-dimensionally integrated semiconductor memory by applying the inventive method. Here, the inventive method relates to a specific step during the process for producing a three-dimensionally integrated semiconductor memory. This inventive process step (channel hole etching) serves to generate a vertical channel structure 112 (channel hole) and is performed by applying an anodic etching process according to the invention.

First, FIG. 3A shows a vertical or three-dimensional layer stack 100 in an original or starting state. The layer stack 100 is arranged on a substrate 200. The layer stack 100 can be generated by alternately depositing several individual layers 101 of a first material as well as several individual layers 102 of a different second material on the substrate 200. The individual layers 101, 102 can be deposited, for example, on top of each other or can be grown epitaxially.

The individual layers 101, 102 or the materials of the individual layers 101, 102 are selected such that the same have a very high etching selectivity with respect to each other. For example, the individual layers 101 of the first material can comprise germanium (Ge) or silicon germanium (SiGe) or can consist of germanium or silicon germanium. The individual layers 102 of the second material, on the other hand, can comprise silicon (Si) or can consist of silicon.

As mentioned above, a high etching selectivity between the two types of individual layers 101, 102 can also be obtained in that the individual layers 101, 102 each have different types of doping and/or degrees of doping. The reason why a high etching selectivity should exist between the individual layers 101 of the first material and the individual layers 102 of the second material will be discussed in more detail below with reference to 3J.

Apart from the etching selectivity, the type of doping or degree of doping has a further reason. For the purpose of anodic etching that will be subsequently described in more detail below, it is advantageous when both types of individual layers 101, 102, i.e., both the individual layers 101 of the first material as well as the individual layers 102 of the second material, are electrically conductive. This can also be adjusted by means of the type of doping and/or the degree of doping of the respective individual layers 101, 102.

In the inventive method, the individual layers 101 of the first material and/or the individual layers 102 of the second material can additionally have an amorphous structure. This means the individual layers 101, 102 do not necessarily need to have a crystalline structure. For example, the individual layers 101, 102 can comprise or can consist of amorphous silicon or amorphous silicon germanium.

In the example shown in FIG. 3a, an individual layer 101 of the first material (e.g., SiGe) is merely exemplarily arranged as bottom or first layer on the substrate 200. Further individual layers 102 of the second material as well as further individual layers 101 of the first material are then each arranged alternately on top of each other on this first individual layer 101. This results in a vertical layer stack 100 with several individual layers 101, 102 of the first and second material arranged alternately. The order of the individual layers 101, 102 can also be exchanged such that, for example, an individual layer 102 of the second material is arranged as first layer on the substrate 200.

It would be possible that a first electrode structure 250 is arranged between the substrate 200 and the lowest individual layer 101, 102. This first electrode structure 250 can comprise a contact portion 251 for electrical contacting. An electric potential $U_1$ can be applied to the contact portion 251. The element to which the first electric potential $U_1$ is applied is also referred to as first potential contact.

The first electric potential $U_1$ can have a specific value. For example, the first electric potential $U_1$ can be a ground potential.

The first electrode structure 250 can be connected to the first or lowest individual layer 101 of the layer stack 100 in an electrically conductive manner, such that the lowest individual layer 101 is also at the first electric potential $U_1$ and hence forms the first potential contact. Instead of the first electrode structure 250, the lowest individual layer 101 can also be contacted directly, as discussed above exemplarily with reference to FIG. 2.

On a side opposite to the substrate 200, i.e., on the top of the layer stack 100, a last or top individual layer is arranged. In the example shown in FIG. 3A, this is an individual layer 102 of the second material. It would also be possible that an individual layer 101 of the first material forms the top layer.

A second electrode structure 252 can be arranged on this top layer 102. Here, the top layer 102 can be structured in a predefined manner. Here, reference is made to FIG. 3B. Here, it can be seen that one or several vertical recesses 111 are to be generated.

As can again be seen in FIG. 3A, the top layer 102 can be structured such that parts 102A of the top layer 102 remain at those locations where, in the subsequent process step (FIG. 3B), the vertical recesses 111 (FIG. 3B) are to be formed. At other locations, i.e., locations where no recesses 111 are to be formed, the top layer 102 can be removed.

The top second electrode structure 252 can be arranged on the structured top layer 102 or on the remaining portions 102A of the structured top layer 102, such that the structured top layer 102 contacts the second electrode structure 252 in an electrically conductive manner.

The second electrode structure 252 can comprise a contact portion 253 for electrical contacting. A second electric potential $U_2$ can be applied to the contact portion 253. The element where the second electric potential $U_2$ is applied is also referred to as second potential contact.

The electric potential $U_2$ can have a value differing from the first electric potential $U_1$, such that a potential drop or electric voltage is formed. This can be an electric alternating voltage or a direct voltage.

As the second electrode structure 252 is connected to the last or top structured individual layer 102 of the layer stack 100 in an electrically conductive manner, the top structured individual layer 102 is also at the electric potential $U_2$. Thus, in this example, the structured top individual layer 102 forms the second potential contact. The top structured individual layer 102 can also be contacted directly, as discussed above exemplarily with reference to FIG. 2.

One of the two electric potentials $U_1$, $U_2$ can be a ground potential. The electric voltage resulting at the two potential contacts can be a direct voltage or an alternating voltage. For example, a direct voltage or an alternating voltage can be applied between the first potential contact or a first portion 210 of the layer stack 100 (e.g., the bottom individual layer 101) and the second potential contact or a second portion 220 of the layer stack 100 (e.g., the top structured individual layer 102). For this, for example, a suitable voltage source can be connected to the two electrodes 250, 252 or potential contacts.

Due to the applied voltage or due to the potential difference between the two electric potential $U_1$ and $U_2$, an electric current 260 flows between the two potential contacts, in this example between the top structured layer 102 and the bottom layer 101.

As can be seen in FIG. 3B, one or several vertical recesses 111 are generated in the layer stack 100. These vertical recesses 111 are structured in the substrate stack 100. For this, an anodic etching method can be applied.

However, it should be mentioned here that the application of an anodic etching method for generating the vertical recesses 111 is merely optional. The vertical recesses 111 are not so-called channel holes but recesses where support structures 105 (FIG. 3E) are to be generated subsequently. These support structures 105 can, for example, form a gate NAND structure. Thus, the vertical recesses 111 described herein can also be generated with other etching methods.

The inventive process step relates to the step of the so-called channel hole etching for generating vertical channel structures 112 (channel holes), which will be discussed in more detail with reference to FIGS. 3E to 3H. For this, according to the invention, an anodic etching method is used. This provides the advantage that the layer stack 100 as a whole can include more individual layers 101, 102. For that reason, it can also be suitable to generate the vertical recesses 111 described with reference to FIGS. 3A to 3D also by using an anodic etching method. Still, this remains purely optional.

As long as an anodic etching method is used for generating the vertical recesses 111, in the example shown in FIG. 3A, the electric current 260 flows from the second potential contact (e.g., second electrode structure 252 or the last or top structured individual layer 102 contacted therewith) vertically down in the direction of the first potential contact (e.g., first electrode 250 or the first or bottom individual layer 101 connected therewith).

The electric current 260 can flow through the entire layer stack 100 and can remove the stacked individual layers 101, 102 between the first and second potential contact in current flow direction. This is also referred to as anodic etching. The advantage is that far more than the previously common approximately 100 individual layers can be etched with a very high anisotropy. This means no funnel-shaped neckings of the vertical recesses 111 (see FIG. 1F) are formed in etching direction as in conventional technology.

As can be seen in FIG. 3B, the vertical recesses 111 extend completely or entirely through the layer stack 100, i.e., through all existing individual layers 101, 102. In other embodiments not explicitly illustrated herein, it would also be possible that the vertical channel structures 111 generated by means of anodic etching extend through at least one of the individual layers 101, 102 or through several (but not all) individual layers 101, 102. This depends on what individual layer the first or second electric potential $U_1$, $U_2$ is applied to, i.e., which individual layers form the first or second potential contact. As the electric current 260 only flows between the respective two potential contacts (or individual layers), only the individual layers located between these two potential contacts (or individual layers) are removed or anodically etched. Thus, for example, a vertical recess 111 extending only partly through the layer stack 100, for example from a top of the layer stack 100 not all the way down to the substrate 200 can be generated within the layer stack 100.

FIG. 3C shows an alternative option for anodically etching the vertical recesses 111, wherein the same elements as in FIGS. 3A and 3B are provided with the same reference numbers.

Here, first, a layer stack 100 having several individual layers 101 of a first material and individual layers 102 of a second material arranged alternately on top of each other can be seen. The first or bottom individual layer 101 can form a first potential contact, optionally by means of a first electrode structure 250. The first potential contact can comprise a first electric potential $U_1$.

A difference to the embodiment discussed with reference to FIG. 3A is that a second electrode structure 252, optionally having several electrode portions 252A, 252B can be arranged on the last or top individual layer 102 of the layer stack 100. The top individual layer 110 can, but does not have to, be structured like in FIG. 3A. This means in this embodiment the last or top individual layer 102 can be complete and hence unstructured.

The second electrode structure 252 or its electrode portions 252A, 252B are arranged again at those parts of the layer stack 100 where subsequently the vertical recesses 111 are to be generated (FIG. 3D).

The second electrode structure 252 or its electrode portions 252A, 252B can form a second potential contact and can be connected to a second electric potential $U_2$. The second electrode structure 252 or its electrode portions 252A, 252B can extend on the last or top individual layer 102 along a depth direction, i.e., into the shown drawing plane.

Again, an electric current 260 anodically etching or removing the intermediate individual layers flows between the first and second potential contacts.

As can be seen in the subsequent figures, the previously generated vertical recesses 111 can be filled with a material, such that one support structure 105 each is formed within the respective vertical recess 111. This support structure 105 is connected to the respective individual layers 101, 102 in order to stabilize or support the same mechanically.

For generating such a support structure 105, the vertical recesses 111 can be provided or filled, for example, with a layer system, which forms the channel regions and isolators for the gate and the charge memory of the later NAND memory cell. For occupying or filling the vertical recesses 111, layers are used to generate the isolators and channel region of the NAND memory (gate isolator/memory and channel components). The material used for occupying or filling can comprise, for example, one or several components of the group of silicon oxide, silicon nitride and silicon. A possible layer sequence can be (from inside to outside): silicon oxide, silicon nitride, silicon oxide, silicon. After filling, the respective vertical recess 111 can be closed by layer depositions.

FIG. 3E to 3H show process steps (channel hole etching) to be allocated to the inventive method. These process steps serve to generate vertical channel structures 112 (channel holes) in a layer stack 100 during the production of three-dimensionally integrated semiconductor memories.

In the layer stack 100, a vertical channel structure 112 (channel hole) can be generated (see FIGS. 3F and 3H). Here, the vertical channel structure 112 can be formed, for example, between the support structures 105 (NAND gate structure). While the anodic etching method can merely be applied optionally for generating the above-described vertical recesses 111, anodic etching for generating the vertical channel structure 112 described below with reference to FIGS. 3E to 3H is an inventive step of the method disclosed herein.

As can be seen in FIG. 3E, a first electrode structure 250 can be arranged between the substrate 200 and the first or bottom individual layer 101, 102. The first electrode structure 250 can comprise a contact portion 251 for electric contacting. An electric potential $U_1$ can be applied to the contact portion 251. The element to which the first electric potential $U_1$ is applied is also referred to as first potential contact.

The first electric potential $U_1$ can have a certain value. The first electric potential $U_1$ can, for example, be a ground potential.

The first electrode structure 250 can be connected to the first or lowest individual layer 101 of the layer stack 100 in an electrically conductive manner, such that the bottom individual layer 101 is also at the first electric potential $U_1$ and hence forms the first potential contact. Instead of the first electrode structure 250, the bottom individual layer 101 can also be contacted directly, as has been discussed above exemplarily with reference to FIG. 2.

On a side opposite to the substrate 200, i.e., on the top of the layer stack 100, a last or top individual layer is disposed. In the example shown in FIG. 3E, this is an individual layer 102 of the second material. It would also be possible that an individual layer 101 of the first material forms the top layer.

A second electrode structure 252 can be arranged on this top layer 102. Here, the top layer 102 can be structured in a predefined manner. As can be seen in FIG. 3F, a vertical channel structure 112 (channel hole) is to be generated, which is used in the production method of a three-dimensionally integrated semiconductor memory to introduce an etching medium (e.g., etching gases, wet chemical etching solutions, etc.) into the layer stack 100. The etching medium is used to etch or remove the individual layers 101 of the first material exposed within the vertical channel structure 112 selectively with respect to the exposed individual layers 102 of the second material. This means an etching medium that etches or removes one of the two materials selectively to the respective other material is introduced through the vertical channel structure 112. The individual layers of the one material are removed while the individual layers of the respective other material are not removed, i.e., the same are maintained. This distinguishes the vertical channel structure 112 from the above-discussed vertical recesses 111. As already mentioned, the recesses 111 are not the so-called channel holes.

For generating the vertical channel structure 112 by means of anodic etching, the second electrode structure 252 can be disposed at those locations of the top individual layer 102 where the vertical channel structure 112 is to be generated later (FIG. 3F).

The second electrode structure 252 can be connected to a second electric potential $U_2$ and form a second potential contact accordingly.

Here, again, an electric current 260 anodically etching or removing the intermediate individual layers 101, 102 flows between the first and second potential contact. As a result, the vertical channel structure 112 (channel hole) shown in FIG. 3F is formed.

The vertical channel structure 112 generated by means of the anodic etching method according to the invention can extend between a first or bottom portion 210 (e.g., first potential contact or lowest individual layer) of the layer stack 100 and a second or top portion 220 (e.g., a second potential contact or top layer) of the layer stack 100, essentially in a straight line through the layer stack 100.

The vertical channel structure 112 generated according to the invention by means of the anodic etching method can additionally have an aspect ratio with respect to its length and width of more than 50:1 or more than 100:1.

With the inventive method, layer stacks 100 of more than 100, 200 or even 300 individual layers 101, 102 stacked on top of each other can be processed. This means that more than 100, 200 or even more than 300 individual layers 101, 102 can be etched or removed by means of the anodic etching to generate a vertical channel structure 112 (channel hole). Even up to 1000 or more individual layers 101, 102 can be processed. Anodic etching has a very high anisotropy, which is why the vertical channel structures 112 generated thereby have a relatively constant diameter across their entire length, despite the large aspect ratio.

The vertical channel structure 112 generated according to the invention by means of the anodic etching method can, for example, have a diameter between 20 nm and 150 nm. The diameter of the vertical channel structure 112 can have a deviation of less than 10% or less than 50% across the entire length of the channel structure 112 and can thus remain approximately constant. However, in conventional technology (FIG. 1F), etching of more than the imaged 96 layers would have the effect that the funnel-shaped necking tapers towards the bottom such that the diameter in the bottom region of the vertical channel structure 7 (FIG. 1) deviates by more than 50% from the diameter in the top region.

FIGS. 3G and 3H show an alternative variation for generating the vertical channel structure 112 by means of anodic etching, wherein the same elements as in FIGS. 3E and 3F are provided with the same reference numbers.

Also here, first, a layer stack 100 having several individual layers 101 of a first material and individual layers 102 of a second material that are arranged alternately on top of each other is shown. The first or bottom individual layer 101 can form a first potential contact, optionally by means of a first electrode structure 250. The first potential contact can have a first electric potential $U_1$.

A difference to the embodiment discussed above with reference to FIG. 3E is that a second electrode structure 252 can be arranged on the last or top individual layer 102 of the layer stack 100, wherein this top individual layer 102 is structured in a predefined manner. The top layer 102 can be structured such that at least part 102A of the top layer 102 remains at the locations where the vertical channel structure 112 is to be formed in the subsequent process step (FIG. 3H). At other locations, i.e., at locations where no vertical channel structure 112 is to be formed, the top layer 102 can be removed.

The second electrode structure 252 can now be arranged on the structured top layer 102 or on the remaining portion 102A of the structured top layer 102, such that the structured top layer 102 contacts the electrode structure 252 in an electrically conductive manner.

The second electrode structure 252 can comprise a contact portion 253 for electrical contacting. A second electric potential $U_2$ can be applied to the contact portion 253.

The element to which the second electric potential $U_2$ is applied is also referred to as second potential contact.

The electric potential $U_2$ can have a value differing from the first electric potential $U_1$, such that a potential drop or electric voltage is formed. This can be an electric alternating voltage or a direct voltage.

As the second electrode structure 253 is connected to the last or top structured individual layer 102 of the layer stack 100 in an electrically conductive manner, the top structured individual layer 102 is also at the electric potential $U_2$. Thus, in this example, the structured top individual layer 102 forms the second potential contact. The top structured individual layer 102, however, can also be contacted directly as has been discussed above exemplarily with reference to FIG. 2.

One of the two electric potentials $U_1$, $U_2$, can be a ground potential. The electric voltage resulting at the two potential contacts due to the potential difference can be a direct voltage or an alternating voltage. For example, a direct voltage or an alternating voltage can be applied between the first potential contact or a first portion 210 of the layer stack 100 (e.g. the bottom individual layer 101) and the second potential contact or a second portion 220 of the layer stack 100 (e.g. the top structured individual layer 102). For this, a suitable voltage source can be connected to the two electrodes 250, 252 or potential contacts.

Due to the applied voltage or due to the potential difference between the two electric potentials $U_1$ and $U_2$, again, an electric current 260 flows between the two potential contacts, in this example between the top structured layer 102 and the bottom layer 101.

In this example, the electric current 260 flows from the second potential contact (e.g. second electrode structure 252 or the last or top structured individual layer 102 contacted thereby) vertically down in the direction of the first potential contact (e.g. first electrode 250 or first or lowest or bottommost individual layer 101 connected therewith).

As can be seen in FIG. 3H, the vertical channel structure 112 (channel hole) is generated in the layer stack 100 along the current flow direction. According to the invention, the vertical channel structure 112 is structured by means of an anodic etching method in the layer stack 100.

Here, the electric current 260 can flow through the entire layer stack 100 and can remove the stacked individual layers 101, 102 between the first and second potential contact in the current flow direction.

As can additionally be seen in FIG. 3H, the vertical channel structure 112 extends completely or entirely through the layer stack 100, i.e. through all existing individual layers 101, 102. In other embodiments, not explicitly illustrated herein, it would also be possible that the vertical channel structure 112 generated by means of anodic etching extends through at least one of the individual layers 101, 102 or through several (but not all) individual layers 101, 102. This depends on what individual layer the first or second electric potential $U_1$, $U_2$ is applied to, i.e. which individual layers form the first or second potential contact. As the electric current 260 only flows between the respective two potential contacts (or individual layers), only the individual layers positioned between these two potential contacts (or individual layers) are removed or anodically etched. Thus, for example, a vertical channel structure 112 extending only partly through the layer stack 100, for example from the top of a layer stack 100 not all the way down to the substrate 200 can be generated within the layer stack 100.

Within the vertical channel structure 112, the individual layers 101, 102 are laterally exposed, i.e. the vertical channel structure 112 forms an access to the respective individual layers 101, 102 of the layer stack 100, in this case to the individual layers 101, 102 of the first and second material existing in the layer stack 100 at this time. Thus, within the vertical channel structure 112, the individual layers 101, 102 arranged on top of each other are exposed portion-byportion, such that these individual layers 101, 102 are freely accessible via the vertical channel structure 112.

As mentioned above, in the production method of a three-dimensionally integrated semiconductor memory, the vertical channel structure 112 serves to introduce an etching medium (e.g. etching gases, wet chemical etching solutions etc.) into the layer stack 100. This etching medium is used to etch or remove the individual layers 101 of the first material exposed within the vertical channel structure 112 selectively with respect to the exposed individual layers 102 of the second material. This means one of the two materials is etched or removed or released selectively to the respective other material through the vertical channel structure 112.

For example, an etching medium can flow through the vertical channel structure 112 into the layer stack 100 and reach the respectively accessible individual layers 101, 102 of the first and second material.

Accordingly, the inventive method includes a step of selectively removing the accessible individual layers 101 of the first material of the layer stack 100 while maintaining the individual layers 102 of the second material. Advantageously, this takes place by applying an etching process where an etching medium reaches into the layer stack 100 through the vertical channel structure 112 and reaches the individual layers 101, 102 of the first and second material exposed and accessible within the vertical channel structure 112 and selectively etches out merely the individual layers of one of the two materials from the layer stack 100.

For the above-stated reason it is advantageous when the individual layers 101 of the first material have a high etching selectivity with respect to the individual layers 102 of the second material. As mentioned above, this can be adjusted, among others, by means of the doping (type of doping and/or degree of doping) of the respective individual layers 101, 102.

For selectively etching out specific individual layers, the etching medium (e.g. etching gas) used during the etching process used herein first reaches the individual layers 101, 102 of the first and second material of the layer stack 100 that are exposed therein in portions through the vertical channel structure 112. In combination with the used etching medium, the two materials have a very high etching selectivity with respect to one another. By means of the used etching medium, the individual layers of the one material can be removed very selectively with respect to the individual layers of the respective other material.

For example, the etching medium can etch out the individual layers 101 of the first material selectively to the individual layers 102 of the second material, advantageously in a lateral direction. A lateral direction is a direction running essentially orthogonally to the (vertical) layer direction of the layer stack 100. The layer direction is the direction in which the individual layers 101, 102 are stacked on top of each other, in the present case, for example, vertically towards the top starting from the substrate 200. In that case, the lateral direction would be, for example, a horizontal direction. Accordingly, the individual layers 101 of the first material can be etched out of the layer stack 100 approximately in horizontal direction starting from the vertical channel structure 112. The individual layers 102 of the second material, on the other hand, are not significantly attacked by the used etching medium and are thus not etched out but remain in the layer stack 100.

FIG. 3J shows the resulting layer stack 100 after the selective etching out of the individual layers 101 of the first material. Here, merely the individual layers 102 of the second material remain. Between the remaining individual layers 102 of the second material, voids 108 are formed at the locations where individual layers 101 of the first material were, which have been removed in the meantime. The remaining individual layers 102 of the second material are supported by the support structures 105. The support structures 105 are connected to the substrate 200.

FIG. 3K shows an optional further process step for generating a three-dimensionally integrated semiconductor memory. A third material can be introduced into the voids 108 that were formed between the individual layers 102 of the remaining second material. Here, individual layers 103 of a third material are formed in these voids 108 between the remaining individual layers 102 of the second material. This results in a vertical layer stack 100 with individual layers 102 of the second material and individual layers of 103 of the third material arranged alternately on top of each other.

Introducing the third material into the voids 108 between the remaining individual layers 102 of the second material can be performed, for example, by means of an additive drying process, advantageously of the gas phase. For example, the third material can be introduced into the voids 108 by applying an LPCVD process (LPCVD: Low Pressure Chemical Vapor Deposition). Here, a process gas can be introduced into the process chamber (where the layer stack 100 is located). The process gas reaches, among others, via the vertical channel structure 112, the voids 108 between the individual layers 102 of the second material and expands in the voids 108. Impinging of the gas molecules of the process gas onto the individual layers 102 of the second material has the effect that the third material (e.g. $SiO_2$) grows in the voids 108 between the remaining individual layers 102 of the second material (e.g. Si).

The third material can be different to the second material. The third material can have electrically insulating characteristics. The third material can comprise, for example, silicon (di-)oxide ($SiO_2$) or can consist of silicon (di-)oxide.

FIG. 3L shows a further optional process step for generating a three-dimensionally integrated semiconductor memory. Here, at least one further vertical channel structure 113 is structured into the layer stack 100. As shown exemplarily in FIG. 3L, this further vertical channel structure 130 can again be generated between the support structures 105. Additionally, the further vertical channel structure 112 can be generated by means of an anodic etching method in the manner described above.

This further vertical channel structure 130 extends also from top to bottom vertically through the layer stack 100, e.g. between a first portion 210 (e.g. bottom) of the layer stack 100 and a second portion 220 (e.g. top) of the layer stack 100. This further vertical channel structure 130 extends additionally through at least one of the individual layers 102, 103, advantageously through several individual layers 102, 103 and more advantageously through all individual layers 102, 103 of the layer stack 100 down to the substrate 200. In this case, these are individual layers 102 of the second material and individual layers 103 of the third material.

The further vertical channel structure 113 forms an access to the respective individual layers 102, 103 of the layer stack 100, in this case to the individual layers 102, 103 of the second and third material existing in the layer stack 100 at this time. These individual layers 102, 103 of the second and third material are accordingly exposed within the further vertical channel structure 113 and made accessible via this further vertical channel structure 113.

This further vertical channel structure 113 can also be referred to as channel hole. Thus, the inventive method also includes generating this further vertical channel structure 113 by applying an anodic etching method, wherein everything described above with respect to the layers 101 of the first material and the layers 102 of the second material applies analogously in this step (e.g. generating the vertical channel structure 113) for the layers 102 of the second material as well as for the layers 103 of the third material.

A further optional method step includes selectively removing the individual layers of the one material that have been made accessible relative to the individual layers of the respective other materials. In the present case, the method includes selectively removing individual layers 102 of the second material selectively to the individual layers 103 of the third material. This selective removing takes place by applying an etching process directed in lateral direction by means of a suitable etching medium entering into the layer stack 100 through the further vertical channel structure 113. In this etching step, the etching medium can be an etching gas (dry etching) or a wet chemical etching solution (wet etching).

In the case of a dry etching process, the same can include at least one plasma-supported etching step with a fluorine-containing gas. Dry etching can, for example, be performed as isotropic CDE process (CDE: Chemical Dry Etching) with a fluorine-containing gas, wherein, for example, silicon (as possible material of the individual layers 102) can be etched very selectively to $SiO_2$ (as possible material of the individual layers 103). $SF_6$ can be used as etching gas, for example. In particular, plasma-etchings with a very high $SF_6$ flow, a low $O_2$ flow and a high process pressure allow very selective etchings between Si and $SiO_2$ with an isotropic etching behavior as desired for this etching.

The etching medium (e.g. $SF_6$ gas) reaches, through the further vertical channel structure 113, the individual layers 102, 103 of the second and third material exposed and made accessible within the further vertical channel structure 113. Here, the etching medium removes the individual layers 102 of the second material in lateral direction selectively to the individual layers 103 of the third material, such that after selectively removing the individual layers 102 of the second material merely the individual layers 103 of the third material remain. This means the individual layers 102 of the second material are etched out of the layer stack 100.

FIG. 3M shows a layer stack 100 formed after selectively etching out the individual layers 102 of the second material. Here, merely the individual layers 103 of the third material remain. Voids 109 are formed between the remaining individual layers 103 of the third material at the locations where the individual layers 102 of the second material were, which have been removed in the meantime. The remaining individual layers 103 of the third material are supported by the support structures 105.

FIG. 3N shows an optional further process step, at the end of which a three-dimensionally integrated semiconductor memory 1000 results. A fourth material can be introduced, among others, via the further vertical channel structure 113 into the voids 109 formed between the individual layers 103 of the remaining third material. Here, individual layers 104 of the fourth material are each formed within these voids 109 between the remaining individual layers 103. This results in a vertical layer stack 100 with individual layers 103 of the third material as well as individual layers 104 of the fourth material alternately stacked on top of each other.

The fourth material can be different to the third material. The fourth material can comprise at least one component of the group of tungsten, cobalt, molybdenum, doped silicon and ruthenium or can consist of this component. The individual layers 104 of the fourth material can form a word line of the three-dimensionally integrated semiconductor memory 1000 that is now generated.

The three-dimensionally integrated semiconductor 1000 can in particular be a 3D NAND flash memory. According to a possible embodiment, the three-dimensionally integrated semiconductor 1000 can therefore be, for example, a 3D NAND flash memory.

The gate NAND structure can be integrated in one of the support structures 105 or can be generated after filling the layer stack 100 with the fourth material (e.g. tungsten) by generating a further vertical channel structure in the layer stack 100 and occupying this further vertical channel structure with respective layers.

For the inventive method described herein, it is shown to be particularly advantageous when the individual layers 101 of the first material comprise germanium (Ge) or silicon germanium (SiGe) or consist thereof. GE or SiGe can be etched very precisely by means of dry etching methods, in particular by applying HCl gas and it additionally has very high selectively with respect, e.g., silicon (as material of the individual layers 102). Additionally, both silicon as well as silicon germanium are electrically conductive, such that these materials are excellently suitable to generate a vertical channel structure 112 (channel hole) by applying the anodic etching process described herein. In conventional technology, individual layers of silicon oxide and silicon nitride are used. However, since silicon nitride is not conductive, no anodic etching method can be applied here.

A significant advantage in anodic etching is the very high anisotropy, i.e., the funnel shaped necking known from conventional technology no longer occur (FIG. 1F). Thereby, the vertical channel structure 112 can be generated through significantly more individual layers 101, 102, such that the memory capacity of the layer stack 10 can be increased significantly.

Therefore, the basic idea of the method described herein consists in producing vertical channel structures 112 (e.g. holes or so-called channel holes) with extremely high aspect ratios and high uniformity by anodic etching.

For this, conductive/semi-conductive material is needed. The layer sequences can consist of Si/SiGe layers 101, 102 that are, for example, grown epitaxially as multi layers (sequences of several hundred layers). The invention is not limited to crystalline layers, as the anodic etching method also works with amorph materials. It is decisive that the two materials are semi-conductive for the multilayer system and can be selectively etched by different etching behaviors. The etching selectivity is important for the subsequent production of the flash cell.

As an alternative to Si—SiGe, a different material system can be used, having the following characteristics: layer stacks 100 having several different hundred levels A-B-A-B- . . . can be generated from two different materials A and B, The entire layer stack 100 has a conductivity such that the same can be etched directionally by anodic etching and hence the vertical channel structures 112 (channel holes) can be generated. The materials A and B have a different etching behavior for different etching media, such that for subsequent etching, material A can be selectively etched with respect to material B or vice versa (process order: (1) producing the multi-layer stack of material A and B, (2) channel hole etch, (3) selective etching of A versus B to produce the memory cells).

By using anodic etching, there is the option of obtaining extremely large aspect ratios. Additionally, there is the option of performing hole channel etching in layer systems having many layers.

According to a possible embodiment, during application of the anodic etching method, a direct light source having a predetermined wavelength can be directed to the layer stack 100 to increase the charge carrier density in the layer stack 100 and thereby support the directional anodic etching process.

The light source is a direct light source directed directly onto the layer stack 100. This light is provided in addition to a spatial illumination existing otherwise in the processing room (e.g. clean room). The light source can have, for example, a predetermined wavelength that is greater than the band gap of the respective material of the individual layers 101, 102 of the layer stack 100.

Photons emitted by the light source can excite electrons in the respective individual layer 101, 102. Thereby, the charge carrier density in the respective individual layers 101, 102 can be increased. Due to an increased charge carrier density, the anodic etching process can be optimized. This means the anodic etching process can be accelerated, for example, and/or the directional etching effect, i.e., the anisotropy of the anodic etching process can be increased.

If more layer stacks 100 are generated on a wafer, the light source can be directed onto the wafer to illuminate the layer stack 100 located on the same.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus.

While this invention has been described in terms of several advantageous embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method for generating a vertical channel structure in a layer stack when producing three-dimensionally integrated semiconductor memories, the method comprising:

providing a substrate with a layer stack arranged thereon, the layer stack comprising a plurality of single layers, wherein several single layers of a first material as well as several single layers of a different second material are deposited alternately on top of each other, wherein the first material and the second material are each electrically conductive or semi-conductive, structuring at least one vertical channel structure into the layer stack, wherein the vertical channel structure extends in a vertical direction at least partially through the layer stack, such that one or more of the single layers are exposed inside the vertical channel structure and are made accessible through the vertical channel structure, wherein the step of structuring the vertical channel structure in the layer stack is performed by applying an anodic etching method, wherein a first electric voltage potential is applied to a first portion of the layer stack, and wherein a different second electric voltage potential is applied to a different second portion of the layer stack, such that an electric current flows vertically through the layer stack between the first and the second portion, which generates the vertical channel structure in the layer stack by directional anodic etching.

2. The method according to claim 1, wherein the vertical channel structure generated by means of the anodic etching method comprises an aspect ratio with respect to its length to width of more than 50:1 or more than 100:1.

3. The method according to claim 1, wherein the vertical channel structure generated by means of the anodic etching method comprises a diameter with a deviation of less than 50% across the entire length of the vertical channel structure and thus remains approximately constant.

4. The method according to claim 1, wherein the vertical channel structure extends in a straight line between the first portion of the layer stack and the second portion of the layer stack.

5. The method according to claim 1, wherein the vertical channel structure extends through multiple single layers of the layer stack or wherein the vertical recess extends through all single layers of the layer stack.

6. The method according to claim 1, wherein a plurality of vertical channel structures in a layer stack with more than 100 single layers or more than 200 single layers or more than 300 single layers can be generated with the applied anodic etching method.

7. The method according to claim 1, further comprising selectively removing the single layers of the first material from the layer stack by maintaining the single layers of the second material, by applying an etching process, wherein an etching medium reaches the layer stack through the vertical channel structure and reaches the single layers of the first and second material that are exposed and made accessible inside the vertical channel structure and releases selectively the single layers of the first material from the layer stack.

8. The method according to claim 1, wherein the single layers of the first material and the single layers of the second material comprise an etching behavior that is different for specific etching media, such that the first material comprises a high etching selectivity relative to the second material.

9. The method according to claim 1, wherein the single layers of the first material comprise a first doped semiconductor material or consist of a first doped semiconductor material, and/or wherein the single layers of the second material comprise a second doped semiconductor material or consist of a second doped semiconductor material, wherein the first and the second doped semiconductor material are different.

10. The method according to claim 9, wherein the first doped semiconductor material comprises a different doping type or a different degree of doping compared to the second doped semiconductor material.

11. The method according to claim 1, wherein the single layers of the first material comprise germanium or silicon germanium or consist of germanium or silicon germanium, and/or wherein the single layers of the second material comprise silicon or consist of silicon.

12. The method according to claim 1, wherein the single layers of the first material and/or the single layers of the second material each comprise an amorphous structure.

13. The method according to claim 1, wherein, during the application of the anodic etching behavior, a direct light source with a predetermined wavelength is directed onto the layer stack to increase the charge carrier density in the layer stack and to support thereby the directional anodic etching process.

14. The method according to claim 1, wherein the step of structuring the vertical channel structure in the layer stack using directional anodic etching is performed without presence of a catalyst.

15. The method of claim 1, further comprising a step of providing a first electrode for providing the first electric voltage potential to the first portion of the layer stack, and a step of providing a second electrode for providing the different second electric voltage potential to the different second portion of the layer stack, wherein the electric current flowing vertically through the layer stack between the first and the second portions selectively removes only material residing between the first and second electrodes.

16. The method according to claim 15, wherein the first electrode is directly coupled to the first portion of the layer stack, and wherein the second electrode is directly coupled to the second portion of the layer stack.

* * * * *